(12) United States Patent
Cordes et al.

(10) Patent No.: US 8,159,248 B2
(45) Date of Patent: Apr. 17, 2012

(54) INTERPOSER STRUCTURES AND METHODS OF MANUFACTURING THE SAME

(75) Inventors: Steven A. Cordes, Yorktown Heights, NY (US); Matthew J. Farinelli, Bronx, NY (US); Sherif A. Goma, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/542,935

(22) Filed: Aug. 18, 2009

(65) Prior Publication Data

US 2010/0038126 A1    Feb. 18, 2010

Related U.S. Application Data

(60) Division of application No. 11/741,345, filed on Apr. 27, 2007, now Pat. No. 7,688,095, which is a continuation-in-part of application No. 10/909,111, filed on Jul. 30, 2004, now abandoned.

(51) Int. Cl.
*G01R 31/00* (2006.01)

(52) U.S. Cl. ............ 324/754.18; 324/500; 324/754.1

(58) Field of Classification Search .................. None
See application file for complete search history.

(56) References Cited

U.S. PATENT DOCUMENTS

| | | | |
|---|---|---|---|
| 5,513,430 A * | 5/1996 | Yanof et al. | 29/846 |
| 5,903,161 A | 5/1999 | Amemiya et al. | |
| 5,926,029 A | 7/1999 | Ference et al. | |
| 6,064,216 A | 5/2000 | Farnworth et al. | |
| 6,414,501 B2 * | 7/2002 | Kim et al. | 324/754 |
| 6,586,955 B2 * | 7/2003 | Fjelstad et al. | 324/754.07 |
| 6,891,360 B1 | 5/2005 | Beaman et al. | |
| 7,131,848 B2 | 11/2006 | Lindsey et al. | |
| 7,202,764 B2 * | 4/2007 | Deligianni et al. | 335/78 |
| 7,456,640 B2 | 11/2008 | Breton et al. | |
| 7,619,424 B2 * | 11/2009 | Hoshino et al. | 324/754 |

* cited by examiner

*Primary Examiner* — Melissa Koval
*Assistant Examiner* — Trung Q Nguyen
(74) *Attorney, Agent, or Firm* — Scully, Scott, Murphy & Presser, P.C.; Daniel P. Morris, Esq.

(57) ABSTRACT

Flexible and rigid interposers for use in the semiconductor industry and methods for manufacturing the same are described. Auto-catalytic processes are used to minimize the costs associated with the production of flexible interposers, while increasing the yield and lifetime. Electrical contact regions are easily isolated and the risk of corrosion is reduced because all portions of the interposer are plated at once. Leads projecting from the flexible portion of the interposers accommodate a greater variety of components to be tested. Rigid interposers include a pin projecting from a probe pad affixed to a substrate. The rigidity of the pin penetrates oxides on a contact pad to be tested. Readily available semiconductor materials and processes are used to manufacture the flexible and rigid interposers according to the invention. The flexible and rigid interposers can accommodate pitches down to 25 μm.

19 Claims, 10 Drawing Sheets

INTERPOSER STRUCTURES AND METHODS OF MANUFACTURING THE SAME

RELATED APPLICATIONS

This application is a divisional of U.S. patent application Ser. No. 11/741,345, filed Apr. 27, 2007, which is a continuation-in-part of, and claims priority to, co-pending U.S. patent application Ser. No. 10/909,111, filed on Jul. 30, 2004.

FIELD OF THE INVENTION

This invention relates to interposer structures used in probing semiconductor wafers and methods of fabricating the same.

BACKGROUND OF THE INVENTION

One of the final stages in the fabrication of integrated circuits on semiconductor wafers is testing and sorting of the functionality of the individual semiconductor chips, the dies. The purpose of testing the dies is to determine if the dies function as they were designed for; i.e., whether the dies produce intended outputs for given inputs. Once functionality is established, the dies are sorted for operating frequency, i.e., the dies are ranked in terms of how fast each die operates. Due to the variations in processing steps, different dies function at different speeds.

There are a variety of techniques employed for testing the dies. One key factor in determining the method of testing the dies is the complexity of the device design. The number of input and output (I/O) pads present on a die is often indicative of the complexity of the design, wherein a higher number of I/O pads is attributed to higher design complexity.

A die with a low number of I/O pads arranged in a linear array can be tested using probe stations where individual probe leads are brought into mechanical contact with each I/O pad. Typically, the number of pads in the linear array is less than, or on the order of, about 25. The individual probe leads provide power and input signals to the input pads and measures output signals from the output pads. For a die with a mid-range number of I/O pads, customized probe cards with many probe leads can be generated wherein the probe leads are arranged to correspond to each I/O pad on the mid-range die. The customized probe cards may also be wired and connected to a tester to provide power and input signals and analyze output signals from the die. For a die with a high number of I/O pads, i.e., those having hundreds to thousands of I/O pads typically in an aerial array, customized probe cards connecting the die to a tester is impractical and expensive, and in some instances impossible. An economical alternative is needed.

Where testing or measuring of the die with customized probe cards is impractical for a die with a high number of I/O pads, it is often advantageous to use packaging mounts, e.g., ceramic or organic modules in which the die to be tested may be mounted, in order to facilitate testing of the die. In this way, wiring from the I/O pads of the die under test to tester compatible pin of the packaging mount is readily available. The temporary wiring, or electrical connections of the I/O pads of the die to the packaging mounts is preferred over permanent packaging of the die since the costly process of forming the permanent packaging may be avoided should the die under test be found defective.

Interposers are devices commonly used in manufacturing for forming temporary electronic connections for the purpose of probing of a semiconductor die with a high number of I/O pads. FIG. 1 is a schematic view of a system in which an interposer 100 provides an electrical connection between a tester 110 and a semiconductor wafer 120. Such interposers offer a convenient way of testing electronic components, such as semiconductor wafers, without requiring a permanent electrical connection, such as solder bonds, between the electronic components and a tester. A permanent electrical connection, such as a die packaging, would have to be dismantled or discarded were the tested component deemed defective. Thus, such interposers often provide a method of economically determining the functionality of semiconductor wafers or semiconductor dies in the semiconductor industry.

Interposers currently in use for testing of semiconductor wafers may be electrolytic plated interposers designed to probe rigid, non-even surfaces such as those commonly associated with ceramic packaging modules. Flexible interposers, which may probe non-rigid surfaces, that are currently available are difficult and cost-prohibitive to fabricate, and requires unusual processing techniques that are not readily practiced. Currently available interposers tend to target rigid substrates, such as silicon dies or silicon substrates.

Thus, current interposers also fail to facilitate probing of flexible substrates that are becoming more common with the use of organic semiconductor materials and flexible substrate materials.

Therefore, there exists a need for a flexible interposer structure for probing flexible, non-rigid semiconductor dies and methods of fabricating the same.

There also exists a need for a more economical interposer structure for probing rigid surfaces and methods of fabricating the same.

SUMMARY OF THE INVENTION

The present invention provides structures for interposers for use with rigid or flexible substrates and methods for fabricating the same in a cost-effective and convenient manner.

Some embodiments of the present invention comprise structures for flexible interposers and methods of fabricating the same while reducing external power supply needs. Methods are provided for fabricating the flexible interposers while reducing precious metals waste. Methods are also provided for fabricating the flexible interposers with minimal nodule formations. These embodiments of the present invention further provide methods for fabricating electroless plated flexible interposers using commercially available electroless metal plating baths.

Other embodiments of the present invention provide methods for fabricating flexible interposers using standard semiconductor processes to improve yield and reduce processing costs. These embodiments of the invention provide for tighter pitches in the interposers than do current technologies, and better facilitate the probing of non-uniform substrate surfaces.

Still other embodiments of the present invention provide methods of fabricating a rigid interposer. The rigid interposer better facilitates probing and testing of flexible substrates.

According to an aspect of the present invention, methods for fabricating interposers are provided. A first method for fabricating a flexible interposer comprises:
  providing a flexible interposer panel containing:
  a flexible insulator sheet;
  pre-plating bumps on one side of the flexible insulator sheet;
  a metal sheet located on another side of the flexible insulator sheet, wherein the pre-plating bumps are connected to the metal sheet through conductive vias;

applying a grayscale photoresist layer for grayscale lithography on the metal sheet;

etching the metal sheet to form pins under the pre-plated bumps;

dicing a plurality of flexible interposer templates out of the flexible insulator panel;

seeding one of the flexible interposer templates with a first metal;

depositing an electroless layer comprised of a second metal on the flexible interposer template by immersion-seeding in a bath provided with a second metal, wherein the second metal is more noble than the first metal; and depositing a third metal onto the electroless layer, wherein the third metal is more noble than the second metal.

The cleaning of the surface may further comprise:

stripping the surface of organics and the photoresist;

oxygen-ashing the surface;

soaking the surface in ethyl alcohol;

rinsing the surface with de-ionized water; and rendering the surface catalytic.

The method may further comprise holding the flexible interposer in a flexible interposer holder during fabrication of the flexible interposer, wherein the flexible interposer holder is comprised of a polymer. The surface of the flexible interposer panel may be Cu, the first metal may be Pd, the second metal may be Ni, and the third metal may be Au.

The depositing of the third metal may comprise:

depositing a first immersion layer of the third metal onto the flexible interposer; and depositing a second electroless plating layer of the third metal directly onto the first immersion layer.

The bath may be constantly agitated and filtered to accommodate more uniform and smooth deposits. The electroless plated layer may be located on both sides of the flexible insulator template. The method may further comprise cleaning, etching and re-plating the flexible interposer as needed to increase the lifetime of the flexible interposer. The electroless layer may be deposited on all sides of the flexible interposer at once.

A second method of fabricating a flexible interposer comprises:

forming a bonded wafer by bonding a thinned wafer to a handle wafer with an adhesion layer therebetween, wherein the handle wafer is selected from the group consisting of a quartz wafer and a silicon wafer;

etching cavities in the shape of inverted pyramids into an exposed surface of the thinned wafer within the bonded wafer using an anisotropic etching process;

forming flexible leads by depositing a seed layer atop the exposed surface of the thin wafer and patterning the seed layer;

forming and patterning an insulating layer over the flexible leads to form joining studs the protrude above the insulating layer;

providing a substrate having a top surface and a bottom surface wherein first via holes extends through the substrate between the top surface and the bottom surfaces thereof, and second via holes that are anisotropically etched on the bottom surface of the substrate;

filling the first via holes with a conductive material to form first vias;

forming a substrate insulating layer on the bottom surface of the substrate, the substrate insulating layer having third via holes that align with the first vias for receiving of the joining studs;

joining the substrate with the bonded wafer, whereby the joining studs are received in the third via holes of the substrate insulating layer and contacts the first vias;

adding metal contacts to the top surface of the substrate; and removing the thinned wafer, the handle wafer, and at least a portion of the insulating layer.

The method may further comprise fabricating wiring structures on the metal contacts. The wiring structures may be contacted using wirebonding techniques. Each of the thinned wafer and the handle wafer may be a silicon substrate. Alternatively, each of the thinned wafer and the handle wafer is a quartz wafer.

The flexible leads may comprise an elastic metal coated with a conductive metal, the combination thereof having a high tensile strength in the range of 450-620 Mpa. The flexible leads may comprise one of BeCu and W. The flexible leads may comprise an elastic polymer having a metal or metallic coating. The flexible leads comprise a rigid material, which may comprise one of silicon or Si3N4 having a conductive or metallic coating. The flexible leads may have a pitch from about 25 µm to about 400 µm.

Multiple cavities may be etched in a cluster during the etching of the cavities for each of the flexible leads. The multiple cavities may comprise an array of cavities. The insulating layer may be an elastic polymer.

The method may further comprise providing a mechanical structure on the substrate for facilitating mechanical alignment of the flexible interposer with a component to be tested. The cavities may be anisotropically etched to form molds. The method may further comprise filling the molds with a conductive material by a technique selected from at least one of electroplating, electroless plating, and screening. The molds may be filled with a hard material selected from the group consisting of PdNi and PdCo.

A method for fabricating a rigid interposer comprises:

etching via holes in a wafer;

filling the via holes with a conductive material to form conductive vias;

depositing a metal layer directly on the conductive vias and the wafer thereby forming a wafer/metal layer combination;

thinning the wafer/metal layer combination to expose bottom surfaces of the conductive vias;

providing metal contacts on the exposed bottom surfaces of the conductive vias; and patterning and etching probes having projecting pins out of the metal layer.

The method may further comprise fabricating wiring structures on one or more surfaces of the metal contacts. The wiring structures may be contacted using wirebonding techniques. The wafer may comprise silicon. The probes may have a pitch from about 25 µm to about 400 µm, and the probes have a sharp point that may penetrate oxides on contact pads of a component to be tested. The pins may comprise a hard material selected from the group consisting of PdNi and PdCo.

According to another aspect of the present invention, flexible interposers and a rigid interposer are provided. A first flexible interposer comprises:

a flexible interposer panel comprising an insulator;

at least one probe located on the flexible interposer panel and seeded with a first metal;

a first electroless plated layer comprising a second metal that overlies the first metal; and a second electroless plated layer comprising a third metal that overlies the second metal.

The at least one probe comprises copper, the third metal is electrochemically more noble than the second metal, and the second metal is electrochemically more noble than the first metal. The first metal may be Cu seeded with Pd, the second metal may be Ni, and the third metal may be Au.

The first electroless plated layer and the second electroless plated layer may be located on both sides of the flexible interposer panel. The first flexible interposer may further comprise electrically isolated regions located between the at least one probe, wherein the at least one probe is a plurality of probes.

A second flexible interposer comprises:

a substrate having a top surface and a bottom surface wherein first vias comprising a conductive material extend through the substrate between the top surface and the bottom surfaces thereof, and a second set of via holes that are anisotropically etched along the bottom surface of the substrate;

a substrate insulating layer located on the bottom surface of the substrate, the substrate insulating layer having third via holes underneath a portion of the first vias;

at least one flexible lead having a tip in the shape of an inverted pyramid and a joining stud abutting one of the first vias through one of the third via holes; and contacts to the top surface of the substrate.

The at least one flexible lead may be cantilevered from the substrate. The second flexible interposer may further comprise wiring structures located on the metal contacts.

Each of the at least one flexible lead may comprise an elastic metal coated with a conductive metal, wherein the combination of the elastic metal and the conductive metal has high tensile properties. Each of the at least one flexible lead may comprise an elastic polymer having a metal or metallic coating. Each of the at least one flexible lead may comprise one of BeCu, W, Si and Si3N4. Each of the at least one flexible lead may comprise a rigid material. The at least one flexible lead may be a plurality of flexible leads having a pitch from about 25 μm to about 400 μm. Each of the at least one flexible lead may have multiple tips in the shape of inverted pyramids. The multiple tips may comprise an array for contacting a bump to be probed.

A rigid interposer comprises:

a wafer having a top surface and a bottom surface;

conductive vias comprising a conductive material, located within the wafer, and extending from the top surface to the bottom surface;

metal contacts abutting the conductive vias and the bottom surface; and probes having projecting pins and abutting the conductive vias and the top surface.

The rigid interposer may further comprise wiring structures located on the metal contacts. The wiring structures may be contacted using wirebonding techniques. The probes may have a pitch from about 25 μm to about 400 μm. The wafer may comprise Si. Each of the probes may comprise a metal pad having the projecting pins, wherein the projecting pins may penetrate oxides on contact pads of a component to be tested. The projecting pins may comprise a hard material selected from the group consisting of PdNi and PdCo.

One of ordinary skill in the art should appreciate that interposers can be designed to reduce oxidation of tester components, to increase flexibility of tester components, and to overcome mismatch between connected tester components. Accordingly, the interposers and methods of manufacturing the same, as described herein, are understood to accommodate these aspects as well.

The above and other features of the present invention, including various novel details of construction and combination of parts, will be more particularly described with reference to the accompanying drawings and claims. It will be understood that the various embodiments of the present invention described herein are shown by way of illustration only and not as a limitation thereof. The principles and features of the invention may be employed in various alternative embodiments without departing from the scope of the invention.

BRIEF DESCRIPTION OF THE DRAWINGS

These and other features, aspects and advantages of the systems and methods of the invention will become better understood with regard to the following description, drawings, and appended claims, wherein:

FIG. 2A is a top-down at the step corresponding to FIG. 2B. FIG. 2C is a bottom view at the step corresponding to FIG. 2D. FIGS. 2B, 2D-2I are sequential cross-sectional views along the plane corresponding to B-B' in FIG. 2A or FIG. 2C. FIG. 2B is a cross-section of FIG. 2A and FIG. 2D is a cross-section of FIG. 2C.

DETAILED DESCRIPTION OF THE INVENTION

Figure 1:
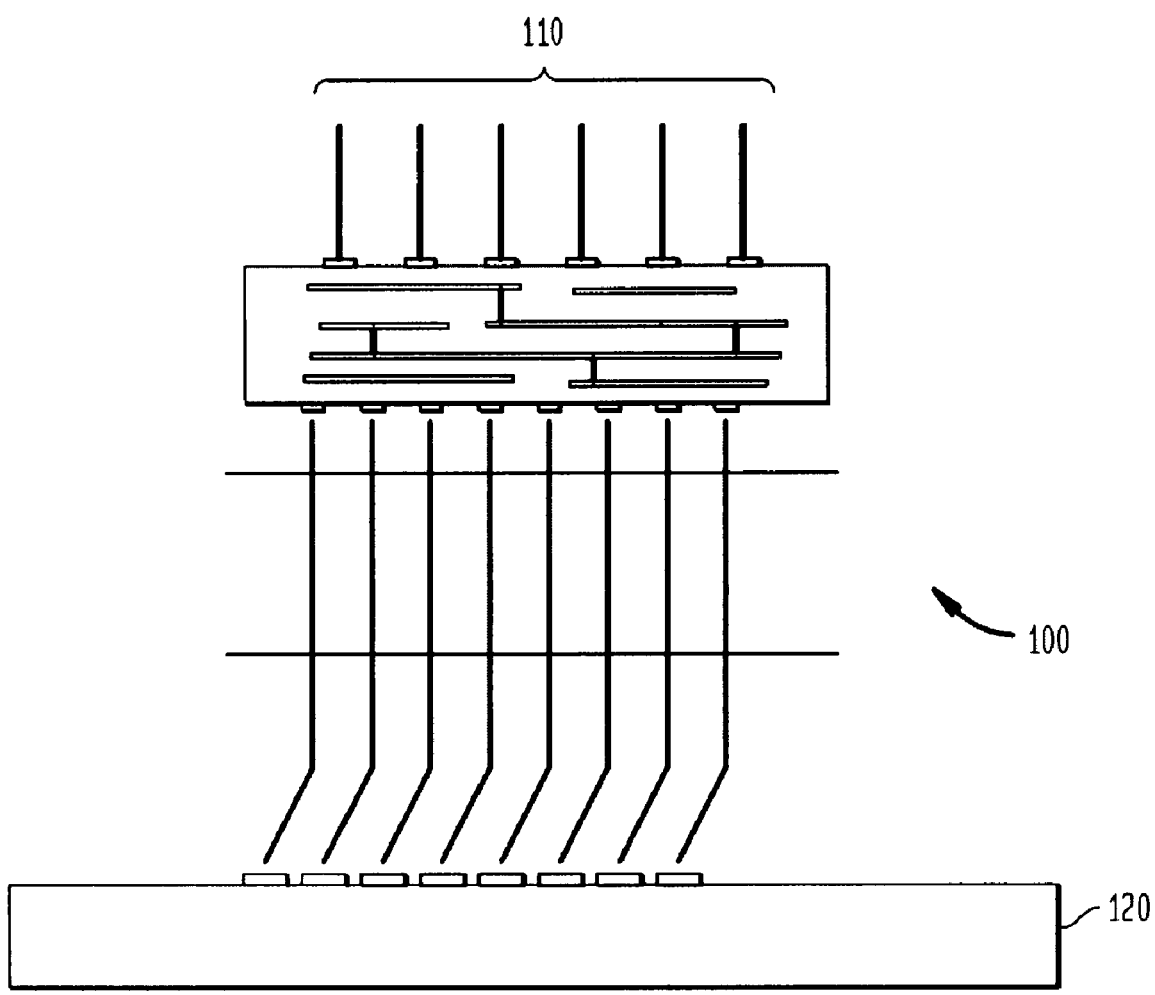
FIG. 1 shows a conventional flexible interposer connecting an electronic component to a wafer.

Electroless plating refers to the autocatalytic reduction of a metal ion at a cathodic surface. The metal ion in solution reduces at the surface of the work piece through a parallel oxidation reaction. For example, a hypophosphite anion can be oxidized according to the following reaction:

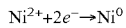
$$Ni^{2+}+2e^-\rightarrow Ni^0$$

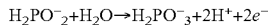
$$H_2PO_2^-+H_2O\rightarrow H_2PO_3^-+2H^++2e^-$$

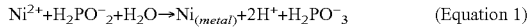
$$Ni^{2+}+H_2PO_2^-+H_2O\rightarrow Ni_{(metal)}+2H^++H_2PO_3^- \quad \text{(Equation 1)}$$

Equation 1 renders hydrogen evolution as a result of the plating process. Excess hydrogen production can interfere with the quality of the plated film, however, and should be avoided by proper bath agitation and/or additions of surface dewetting agents. Commercially available electroless solutions contain stabilizers to control the reaction rates of Equation 1. Electroless plating baths also contain various metal salts, reducing agents and organics to buffer and maintain the solution as well as to adjust properties such as hardness and the appearance of deposits in the plating film. The advantage of the reaction of Equation 1 is that it does not rely on an external supply of electrons to reduce the metal ions. As a result, conformal depositions may occur on any active surface.

Some embodiments of the present invention comprise an electroless plating process for fabricating flexible interposer probes. According to these embodiments, the electroless plating process uses conformal metal coatings without external power supplies or complicated commoning methods. Because no external power source is used, nodule formations are minimized. Such nodule formations tend to occur at points of high current densities, e.g., at sharp edges, when forming flexible interposer probes using standard electrolytic plating techniques. Further, because electroless plating solutions of the invention contact all parts of the interposer, electrically isolated regions need not be electrically connected to one another by a commoning layer, such as a deposited thin film of Cu, for example. Further still, the electroless plating techniques described herein improve the manufacturability and reduce the cost of interposers as compared to known interposer fabricating technologies.

Electroless plating, according to the present invention, begins by forming a surface that is clean and catalytic. The artisan will appreciate that numerous techniques exist for creating an autocatalytic surface with a variety of chemicals, though for brevity the discussion herein focuses on those chemicals most suited for electroless deposition on copper as most probe panels use copper as its plating surface. The standard method of creating a catalytic surface is by utilizing an immersion, or displacement, deposit of a more noble and catalytic metal such as zinc (Zn), palladium (Pd), or tin (Sn).

The galvanic series, or electropotential series, known in chemistry determines the nobility of metals and semi-metals. When two metals are submerged in an electrolyte, while electrically connected, the less noble metal will experience galvanic corrosion. The rate of corrosion is determined by the electrolyte and the difference in nobility. The difference can be measured as a difference in voltage potential. Galvanic reaction is the principle on which batteries are based.

The following is a galvanic series for stagnant seawater, that is, water having low oxygen content, for a selection of elemental metal and metal compounds. The elements are listed in the order of decreasing nobleness, i.e., from the most noble element in the beginning to the least noble element at the end: Graphite, Palladium, Platinum, Gold, Silver, Titanium, Stainless steel (316 passive), Stainless Steel (304 passive), Silicon bronze, Stainless Steel (316 active), Monel 400, Phosphor bronze, Admiralty brass, Cupronickel, Molybdenum, Red brass, Brass plating, Yellow brass, Naval brass 464, Uranium with 8% Mo, Niobium with 1% Zr, Tungsten, Stainless Steel (304 active), Tantalum, Chromium, Nickel (passive), Copper, Nickel (active), Cast iron, Steel, Lead, Tin, Indium, Aluminum, Uranium (pure), Cadmium, Beryllium, Zinc, and Magnesium.

For description of the present invention, the order of decreasing nobleness in stagnant sea water as listed above is employed. It is noted, however, that the order may change in different environments and that the present invention may be practiced when relative electrochemical nobleness of elements are altered in a different environment, i.e., in a solution with a different composition.

Displacement deposits occur when a metal surface with a lower free energy, i.e., electrochemically less noble, is placed into a solution containing metal ions that are at a higher free energy, i.e., more noble. The difference in the thermodynamic free energies drives the reaction that replaces the metal atom on the surface with the metal atoms from the solution. The kinetics of the reaction are governed by the fractional surface coverage of the replacement atom on the surface. As the fractional coverage of the surface increases, the reaction slows down. A typical example of this reaction is that of a Cu metal surface being displaced by Pd atoms from an acidic solution. The reaction is described by Equation 2 below:

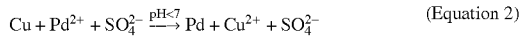

(Equation 2)

In the above reaction described by Equation 2, the Cu atoms on the plating surface are displaced by the Pd atom because of a reaction potential of −1.293 V driving the Pd atom to cover the surface. The pH of the solution is adjusted to be acidic by the addition of sulfuric acid, for example. The acid helps to prevent oxidation at the Cu surface and favors the removal of Cu metal as copper sulfate. The reaction of Equation 2 will cease once the surface has been fully covered with Pd atoms. Immersion deposits can range from a few hundreds of angstroms to a few microns in thickness depending on the metal systems used.

Table 1 below illustrates chemistries and processes used in the production of electroless plated probes according to some embodiments of the invention.

TABLE 1

| Electroless plating chemistries used in the production of probes. (Cu Preclean Procedure: Strip all resist coatings, Soak in Ethyl Alcohol with ultrasonic agitation for 5 minutes, DI Water Rinse, Oxygen Ash at 100 W for 5 min in 650 mTorr of $O^2$) | | |
|---|---|---|
| ENPLATE NI426 | Oromerse MN | Gobright TMX-21 |
| Operating temperature: 83° C. Operating pH = 6.2 Optimal plating rate = 15-18 μm/hr @85° C. | Operating Temperature: 70° C. Operating pH = 5.5 Optimal plating rate = 5-7 nm/min Maximum Au Thickness = 0.3 μm | Operating Temperature: 55° C. Operating pH = 7.4 Optimal Plating Rate = 1.5 μm/hour Minimal part agitation |

According to an aspect of the present invention, there are five primary steps to the electroless plating process according to the invention. The steps generally are:

1. pre-cleaning an interposer template
2. seeding the interposer template
3. depositing a first electroless layer on the interposer template
4. immersion seeding the interposer template
5. depositing a second electroless layer on the interposer template.

For example, the initial seeding is Pd seeding, the initial electroless layer Ni, the immersion seeding is Au, and last electroless layer is Au.

Figure 2A:
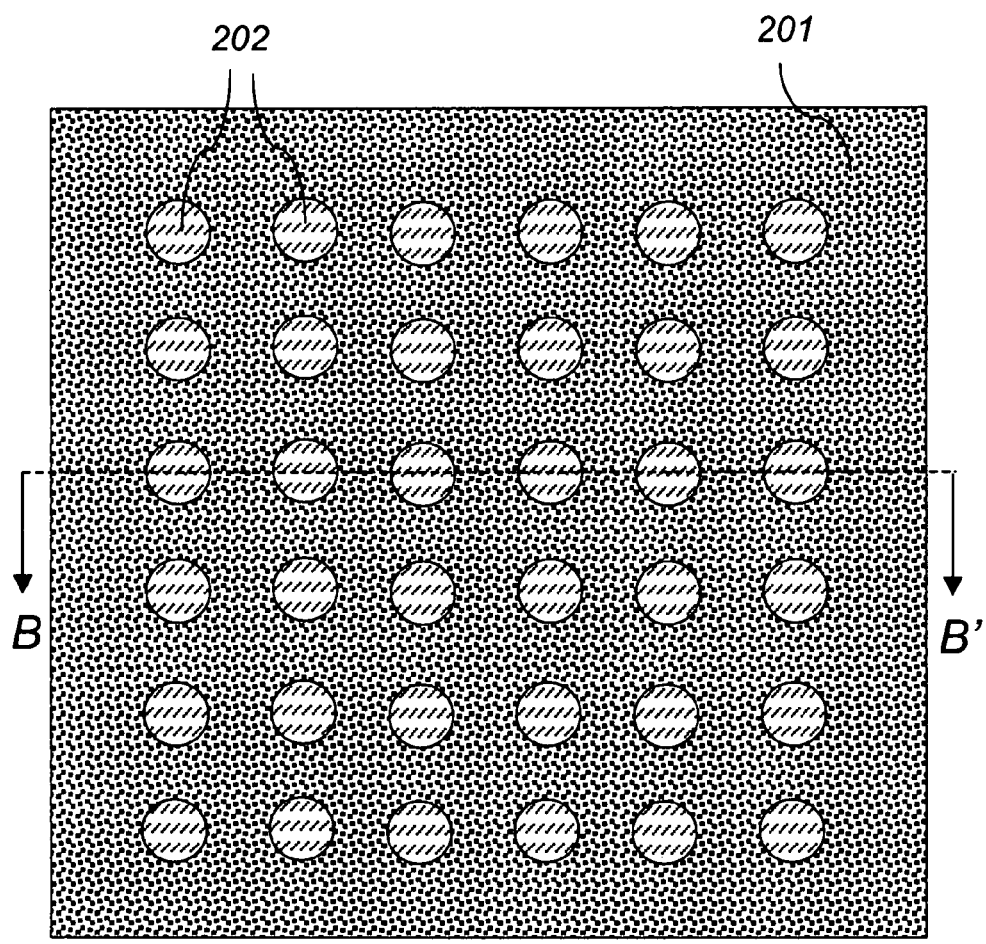
FIGS. 2A-2I show a first flexible interposer at various stages of manufacturing process according to an embodiment of the present invention.
Figure 2B:
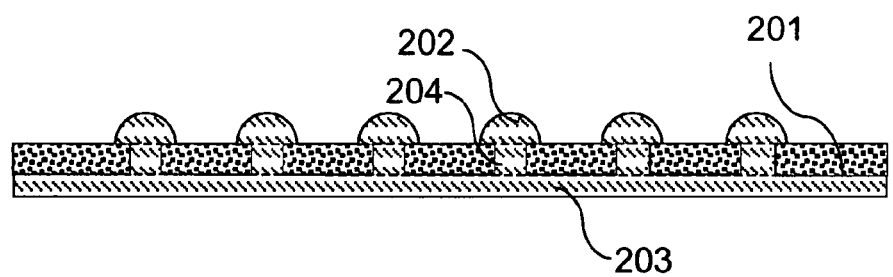

Referring to FIGS. 2A-2B, a flexible interposer panel is provided which contains a flexible insulator sheet 201 with pre-plating bumps 202 on one side and a metal sheet 203 on the other side. FIG. 2A is a top-down view of the flexible interposer panel. FIG. 2B is a vertical cross-sectional view of the flexible interposer panel along the plane B-B' in FIG. 2A. The pre-plating bumps 202 are connected to the metal sheet 203 through conductive vias 204. The pre-plating bumps 202 may be formed by depositing a layer of metal followed by a lithographic patterning and etching. Preferably, each of the pre-plating bumps 202 is connected to the metal sheet 203 by one of the conductive vias 204. The pre-plating bumps 202 may comprise copper.

Figure 2C:
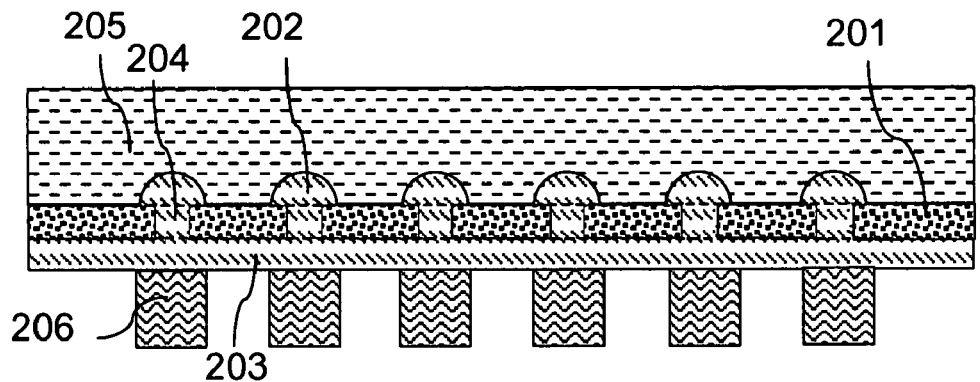
Figure 2D:
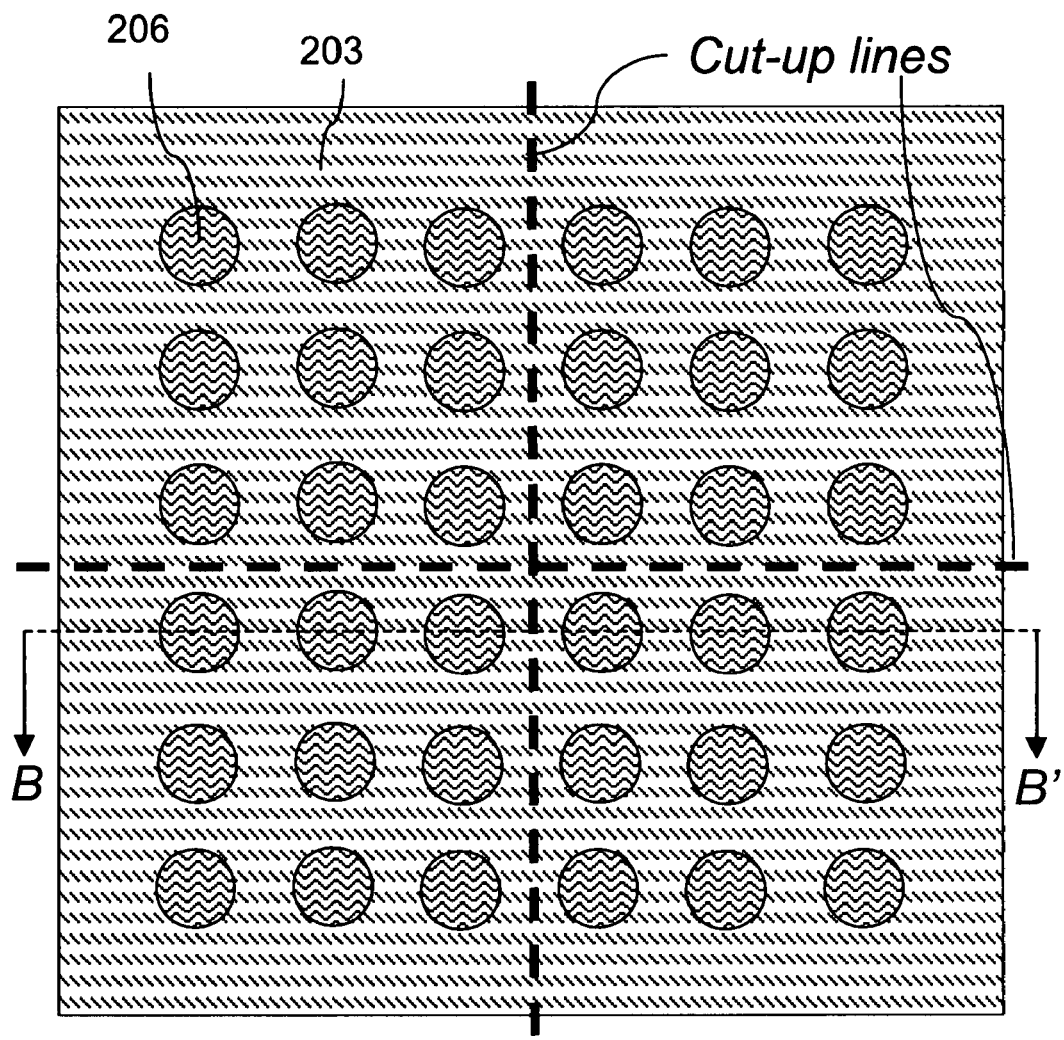

Referring to FIGS. 2C-2D, a spin-on photoresist 205 or a dry film laminate is applied to protect the pre-plating bumps 202 from a grayscale etching solution, while a grayscale photoresist 206 is applied onto the metal sheet 203 and is patterned. FIG. 2C is a vertical cross-sectional view of the flexible interposer panel along the plane B-B' in FIG. 2D. FIG. 2D is a bottom view of the flexible interposer panel. A plurality of flexible interposer sheets may be cut, for example, from the flexible interposer panel, which may have, for example, a four-up configuration.

Figure 2E:
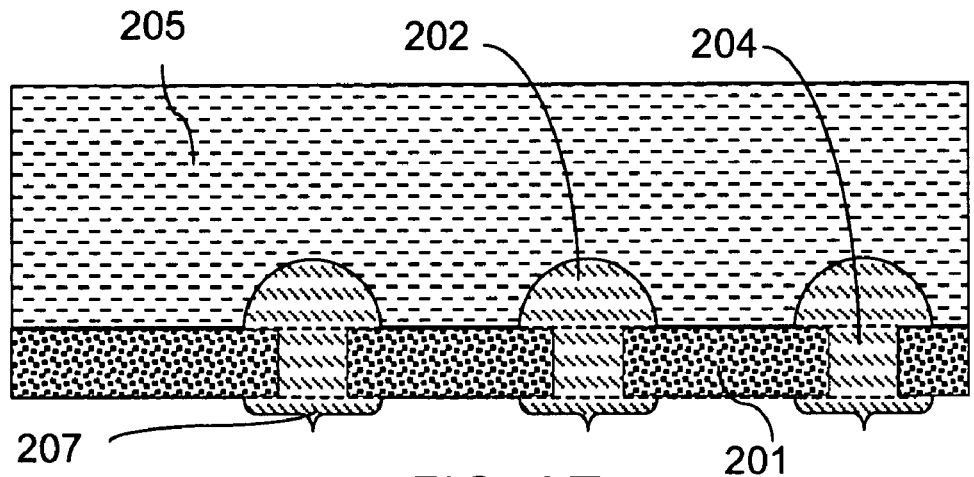

Referring to FIG. 2E, a vertical cross-sectional view of one of the flexible interposer sheet is shown after the grayscale lithography, etching, and the cut-up. Pins 207 are formed out of the metal sheet 203 after the etching.

The flexible interposer sheet is at this point loaded onto a flexible interposer holder (not shown), which may be a custom designed, Delrin® probe holder. Preferably, the flexible interposer holder is made completely of at least one polymer material to avoid plating onto any metal parts. The flexible interposer sheet may be fixed by dowel pin holes and held in a semi-rigid manner. Holding the flexible interposer sheet in this manner helps keep the flexible interposer sheet in a steady position in the baths.

Experimentation of the processes according to the present invention has determined that a clean Cu surface is required for proper Pd seeding and electroless Ni deposition. It is also preferable to strip any organics from the Cu surfaces because the flexible interposer sheet is treated with a benzotriazole solution and other organic chemicals during their production. The flexible interposer sheet is soaked in ethyl alcohol and rinsed in de-ionized (DI) water. The parts are then be oxygen ashed prior to plating to remove any residual organic compounds.

Figure 2F:
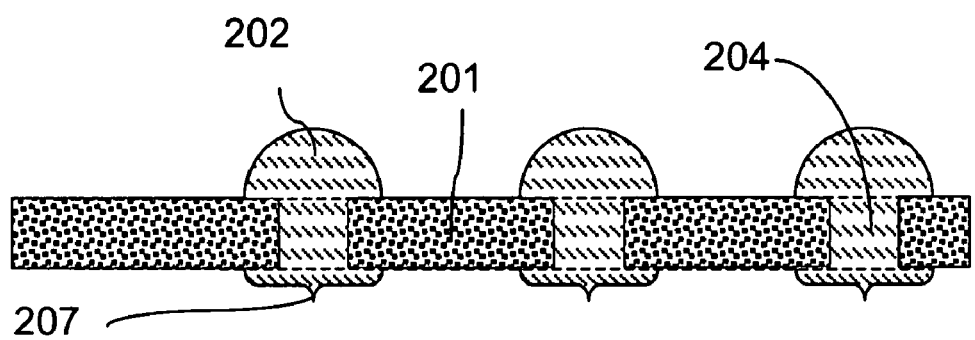

Referring to FIG. 2F, the spin-on photoresist 205 is removed from the flexible interposer sheet. For example, a Branson® barrel asher operating at a frequency of 13.56 MHz and 100 W of power for 10 minutes in a flowing oxygen atmosphere at a pressure of 650 mTorr may be employed. The ashed flexible interposer sheet is then dipped into a 25% sulfuric acid solution for 2 minutes to remove any oxidized copper.

Figure 2G:
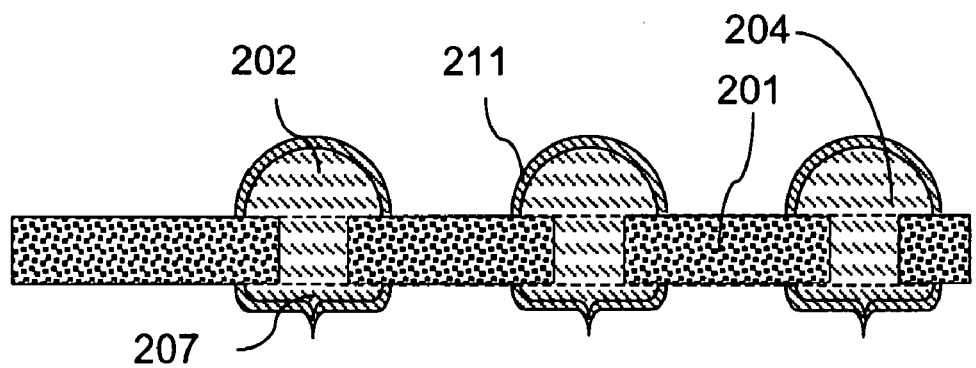

Referring to FIG. 2G, the flexible interposer sheet may then be rinsed in flowing DI water for 30 seconds and dipped into a seeding bath (not shown) for seeding a first metal to form a seeding layer 211. The first metal may be Pd and the seeding bath may be, for example, an acidic palladium sulfate seeding bath (0.1 g/L $PdSO_4$ in 20 mL/L $H_2SO_4$ aqueous solution) and the duration of seeding may last for 5 minutes. This tends to produce a dark tarnish of Pd atoms on the Cu surfaces. Finally, the flexible interposer sheet is rinsed in DI water for 30 seconds to remove any excess Pd seed or acid.

Figure 2H:
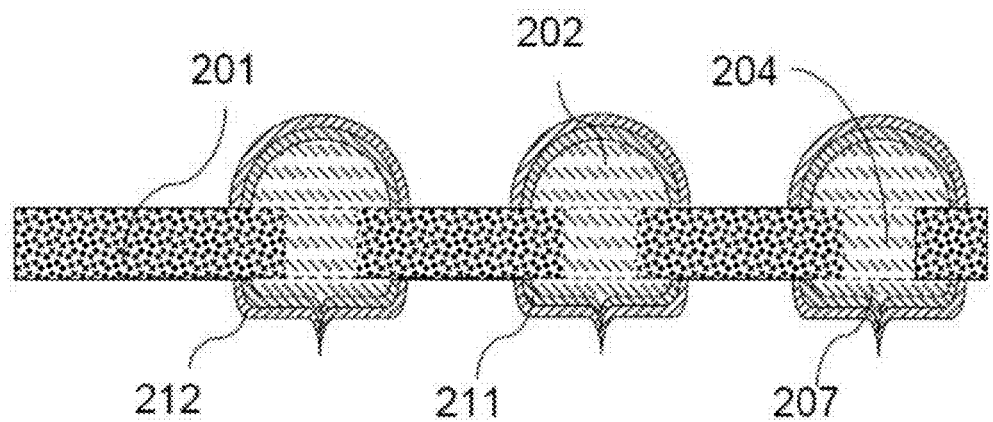

Referring to FIG. 2H, the seeding layer 211, located on the pre-plating bumps 202 and the pins 207 and now having active metallic surfaces, is immersed into an electroless metal bath (not shown) to deposit an electroless layer 212 of a second metal. The electroless metal bath may be an electroless nickel (EN) bath and the second metal may be Ni. The EN bath used in the experimentation of the invention was ENPLATE NI426, which is a low phosphorous plating bath produced by Enthone Corporation. Operating conditions of the EN bath are given in Table 1. According to these conditions, a Ni—P phase diagram should indicate that no solid solubility of phosphorous in Ni at the plating temperature exists and that only a mixture of pure Ni and the intermetallic $Ni_3P$ exists. However, because of the plating rate, it is kinetically impossible for the intermetallic phase to form. Therefore the electroless layer 212 may be a supersaturated alloy of Ni and P. This results in a very hard (650HK100) deposit with a microcrystalline grain structure (grain sizes 2 to 6 nm).

The electroless plating bath is operated under constant agitation and filtration to ensure uniform and smooth deposits. Custom plating tanks and bath heaters are used to accommodate the panels. At a pH of 6.2 and a bath temperature of 83 degrees C., the plating rate is between 15 and 18 µm/hr. Parts are left in the bath for 10 minutes to achieve a 2.5 µm film. The film thicknesses can be confirmed using optical microscopy and SEM imaging. Conformal coverage of the underlying Cu produces a coherent and smooth Ni:P film.

Figure 2I:
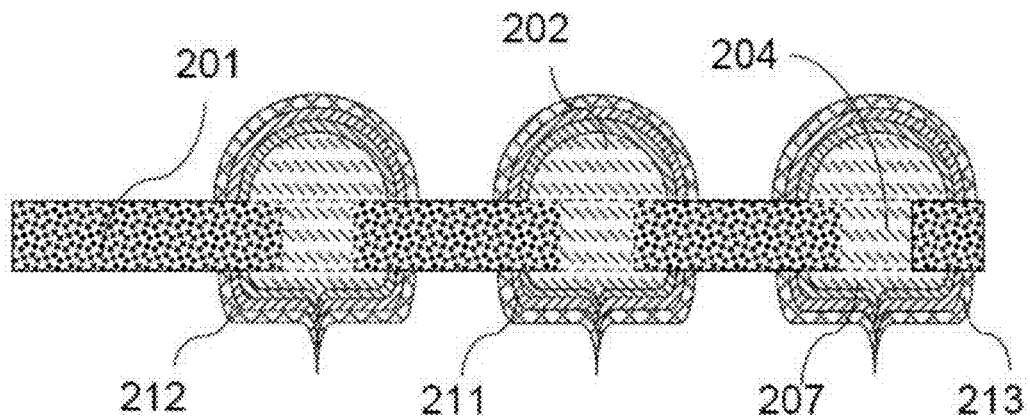

Referring to FIG. 2I, a similar thickness of a third metal is electroplated to ensure good electrical contact for testing. The third metal forms a third metal layer 213 and may be gold (Au). The third metal layer 213 may be formed by a two-step process where a first layer of immersion gold is deposited to a thickness of 0.3 µm, followed by an electroless gold deposition of 2.2 µm to form a second layer of immersion gold. The immersion Au chemistry used may be Oromerse MN® from Techinc Incorporated, and the electroless Au bath may be the GoBright TMS-21® bath from Uyemura International Corporation. Both baths come premixed and ready to use. The operating details are given in Table 1 above. The finished flexible interposer sheet becomes a flexible interposer.

In a simple modification of the standard flexible interposer fabrication process that is described above, the two-step bump/grayscale plating is replaced with a single electroless plating process. The new process can be broken down into three components:
  1. pre-plating bump and pin formation;
  2. flexible interposer sheet removal and cleaning; and
  3. electroless deposition of Ni/Au layers on the flexible interposer sheet.

The first stage of the flexible interposer fabrication process is the formation of the pre-plating bumps 202 and the pins 207. These should be formed using the standard process as a template with the following modifications. First, pre-plating bumps 202 are formed on a flexible interposer panel. The pre-plating bumps are formed with a standard height and width, as dictated by the original process. The pre-plating bumps 202 may comprise Cu. The pre-plating bumps 202 are protected with a thick resist coat applied by a brush and air dried. The metal sheet 203 are cleaned and coated with a grayscale resist, as required for grayscale lithography and etching. The standard etch procedure is used to form pins 207. The final product is a flexible interposer panel with pre-plating bumps 202 on one side and pins 207 on the opposite side. The flexible interposer panel may contain a plurality of flexible interposer sheets. For example, the flexible interposer panel may be a four-up sheet having four flexible interposer sheets.

At this point, the individual flexible interposer sheets are cut out of the flexible interposer panel to reduce Ni and Au plating waste. Each flexible interposer sheet is then cut from the flexible interposer panel and cleaned to ensure that all organics are removed before electroless plating begins. The electroless deposition of Ni and Au is then performed.

The following process and solutions, for example, may be used to produce flexible interposers according to the invention:
  1. Dip a flexible interposer sheet into 25% $H_2SO_4$ for 2 minutes and rinse with DI water for 30 seconds.
  2. Dip the flexible interposer sheet into Pd seed solution for 4 minutes and rinse for 30 seconds.
  3. Dip the flexible interposer sheet into ENPLATE Ni426® plating solution for 12 minutes and rinse for 1 minute (the metal probes should be shiny and silver colored now).
  4. Dip the flexible interposer sheet into Oromerse MN® solution for 30 minutes and rinse for 30 seconds (0.2~0.3 µm Au film achieved).

5. Dip the flexible interposer sheet into Gobright® solution for 90 minutes (2.2~2.3 μm film achieved).

Figure 3:
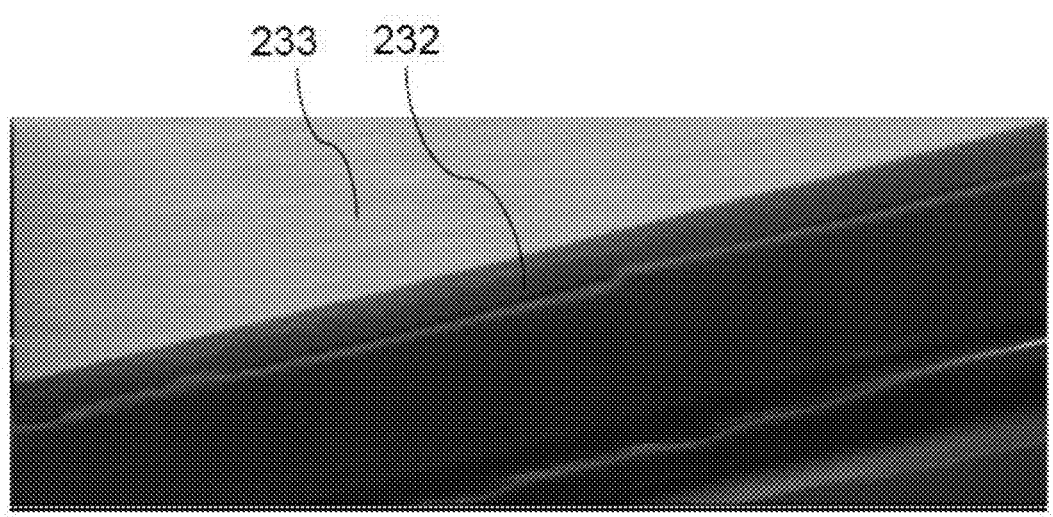
FIG. 3 shows a scanning electron micrograph (SEM) micrograph of a cross section of a surface of an electroless plated probe according to the present invention.

FIG. 3 shows an SEM micrograph of the cross section of a surface of the flexible interposer sheet. The top two layers in the image are the electroless Au layer 233 and the electroless Ni layer 232. Note the uniformity of the coverage. The electroless Ni layer 232 measures approximately 3.0 μm and the electroless Au layer 233 measures approximately 2.5 μm. Although not shown, the electroless Ni layer 232 is seen to penetrate into the micro-roughened Cu surface at higher magnifications. This penetration forms a strong interface between the Ni and Cu surfaces.

The above described processes offer several advantages over other fabrication methods. For example, the underside of the flexible interposer panel that contacts the grayscale photoresist 206 is plated with a stack of protective layers, i.e., a stack of the electroless Ni layer 212 and the electroless Au layer 213. In standard electrolytic plating, this part of an interposer would not be coated, and would therefore be subject to corrosion and other degradation. Acidic agents are typically used to clean currently available interposers according to strict cleaning schedules in order to remove lead and tin deposits, for example. Such acidic agents are often a primary cause of corrosion on an underside of the probes. Eliminating the need for these acidic agents renders the probes fabricated by the processes described herein more reliable and more convenient as well.

The flexible interposers fabricated by the electroless plating processes described herein are more easily repaired than currently available interposers as well, particularly where the interposers have already been used and/or have suffered damage to the stack of protective layers. Once a damaged probe is identified, it can be cleaned and re-plated with another stack of an electroless Ni layer and an electroless Au layer as the original stack of protective layer (212, 213) wears thin or wears out. This process of repair can significantly increase the lifetime of the flexible interposer, and can lower the cost of use as well.

Further, the flexible interposers fabricated by the electroless plating processes described herein may be produced in less steps than currently available interposers. For example, where standard electrolytic plating methods are used, the front side of the interposer and the back side of the interposer are each separately plated. Thus, the electrolytic plating process requires two separate plating procedures for the prior art interposers. On the other hand, the electroless plating processes described herein coats both sides of the flexible interposer at once, thereby saving a significant amount of processing steps.

FIGS. 4A-4H, as will be described in more detail below, illustrate another embodiment of fabricating a flexible interposer according to the invention. In general, the flexible interposer fabricating process illustrated in FIGS. 4A-4H use standard semiconductor processes and materials, as opposed to the more complex procedures and uncommon materials often used to produce currently available flexible interposers.

Figure 4A:
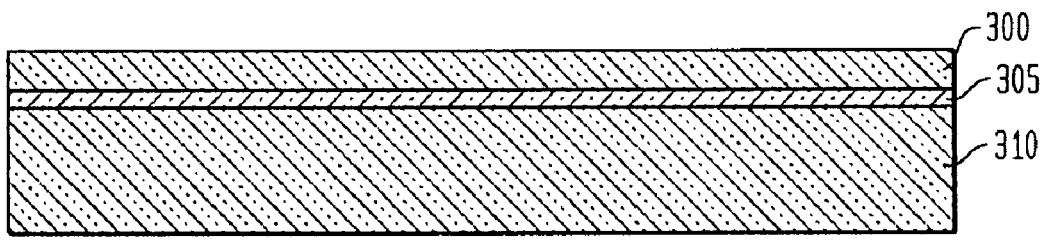
FIGS. 4A-4I show a second flexible interposer at various stages of manufacturing process according to another embodiment of the present invention.

Referring to FIG. 4A, a thinned wafer 300 is bonded to a handle wafer 310 with an adhesion layer 305 therebetween. The thinned silicon wafer 300 may be obtained by thinning a silicon wafer with a normal thickness, e.g., about 800 microns. The handle wafer 310 may be a quartz wafer or a Si wafer. Likewise, the thinned wafer 300 may be a quartz wafer or a Si wafer. The adhesion layer 305 may be an oxide layer or an organic adhesion layer comprising an organic material such as Dupont KJ.

Figure 4B:
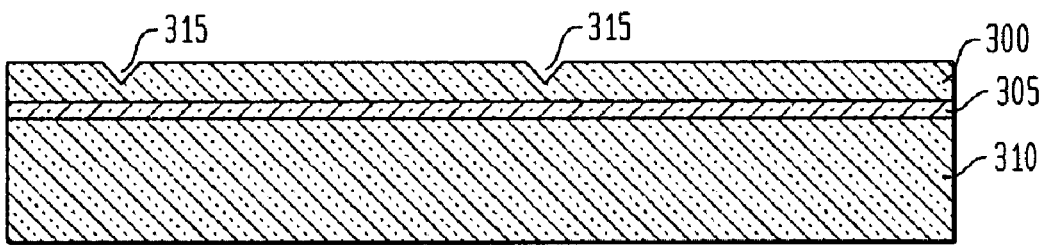

Referring to FIG. 4B, cavities 315 in the shape of inverted pyramids are formed on the exposed top surface of the thinned wafer 300. The cavities 315 may be formed using an anisotropic etch process, for example. The cavities 315 form molds for pins of flexible leads. One of ordinary skill in the art will appreciate that additional multiple cavities, or other shapes, may be formed in a cluster during the etching of the cavities 315. The additional multiple cavities may comprise an array of cavities.

Figure 4C:
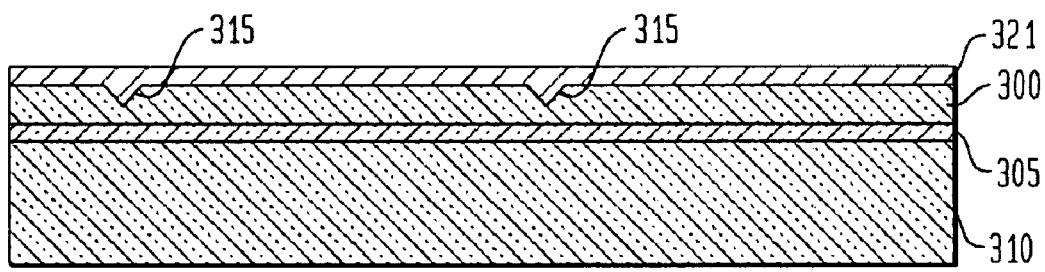

Referring to FIG. 4C, a seed layer 321 is deposited atop the exposed surface of the thinned wafer 300 and fills the cavities 315 in the shape of the inverted pyramids. The molds, which are cavities 315, are filled with a conductive material by a technique selected from at least one of electroplating, electroless plating, and screening. The molds may be filled with a hard material selected from the group consisting of PdNi and PdCo.

The molds are filled with a material, such as a metal, up to a prescribed thickness to create sharp pins. This molding technique provides advantages such as:

producing atomically sharp features using silicon or other single crystalline materials (GaAs, Ge, SiGe, and others);

permitting easier image replication using materials that are easily peeled away, such as Cu, that does not bond well with a Si mold;

providing cleaning of the mold using standard semi-conductor techniques; and providing economical production methods.

Figure 4D:
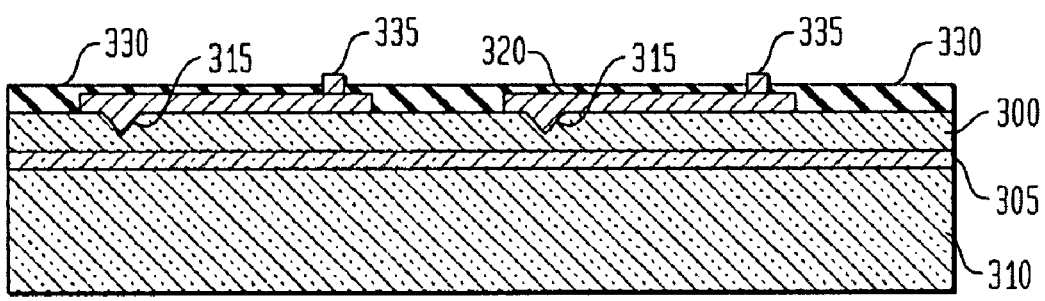

Referring to FIG. 4D, the seed layer 321 is lithographically patterned and etched to form flexible leads 320 and joining studs 335. Preferably, each of the flexible leads 320 has a pin which is formed out of one of the molds. The joining studs 335 protrude out of the flexible leads 320. Preferable, each of the flexible leads 320 also has a cantilever portion to which the pin is attached.

An insulating layer 330 is deposited and patterned over the flexible leads 320 such that joining studs 335 protrude above and surrounded by the insulating layer 330. The insulating layer 330 may be an elastic polymer.

The flexible leads 320 are preferably created using either a flexible organic material coated with a conductive metal, or a metal with good electrical properties while possessing high tensile strength such as, for example, 450-620 MPa and most preferably about 550 MPa. For example, copper beryllium (CuBe) could be used as the material for the flexible leads 320, or an elastic polymer having a metal or metallic coating could be used, although other flexible organic materials known in the art could as well be used as will be appreciated by the skilled artisan. One of ordinary skill in the art will also readily appreciate that the flexible leads 320 could as well be comprised of a more rigid material such as, Si or $Si_3N_4$, for example.

The flexible leads 320 may be employed, for example, to contact solder pads be formed on one side of the interposer to connect to the first vias. The flexible leads 320 are rigid enough to puncture through oxides on the surface of the solder ball to accommodate any non-uniformity in heights.

Figure 4E:
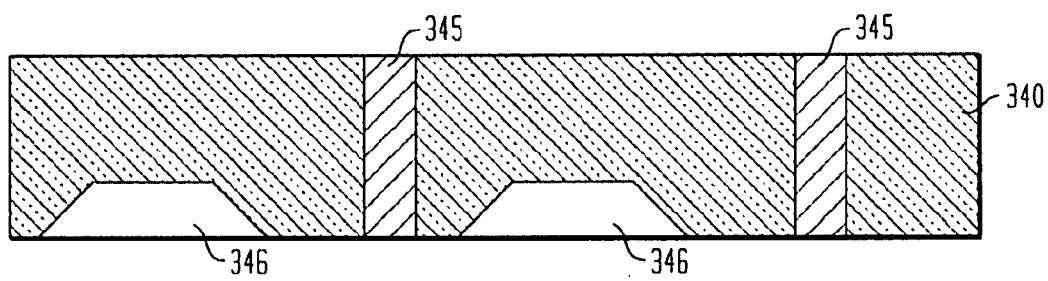

Referring to FIG. 4E, a substrate 340, which may be a silicon wafer, having a top surface and a bottom surface is provided. First via holes are formed through a semiconductor wafer 340. The first via holes are filled with a conductive material, for example, to form first vias 345. The first vias permit a front-to-back connection through the semiconductor substrate 340. The first vias 345 thus connect two structures above and below the semiconductor substrate 340. Depending on the application, the first vias 345 can be built on both sides of the wafer in order to better facilitate probing. Second via holes 346 are anisotropically etched on a bottom surface of the substrate 340.

Figure 4F:
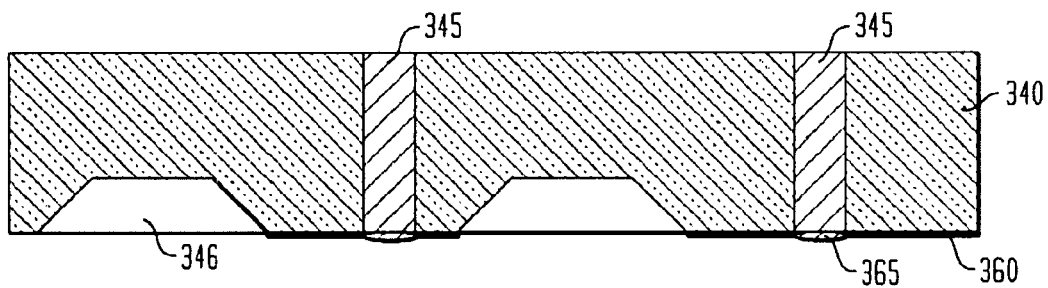

Referring to FIG. 4F, a substrate insulating layer 360 is formed on the bottom surface of the substrate 340. The substrate insulating layer 360 is patterned and etched to form extension via holes such that extension vias 365 are formed on the first vias 345 by deposition of a conductor material. Alternatively, the bottom surface of the substrate 340 may be recessed prior to deposition of the substrate insulating layer 360 and planarized after the deposition of the substrate insulating layer 360 to expose the first vias 340. In this case, the extension vias 365 are portions of the first vias 345.

The substrate insulating layer 360 and the extension vias 365 have third via holes that align with the joining studs 335 on the bonded wafer for receiving the joining studs 335.

Figure 4G:
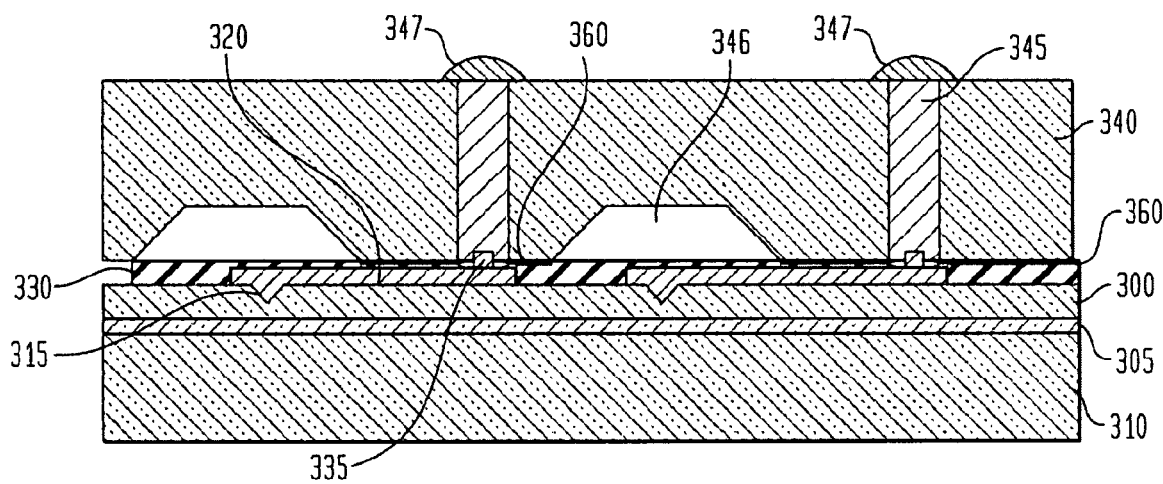

Referring to FIG. 4G, the substrate 340 joined to the bonded wafer comprising the handle wafer 310, the adhesion layer 305, the thinned wafer 300, the flexible leads 320, the insulating layer 330, and the joining studs 335, whereby joining studs 335 are received in the extension vias 365 within the insulating layer 360 that are aligned with the first vias 345 of the substrate 340. Metal contacts 347 are added to the top surface of the substrate 340.

Figure 4H:
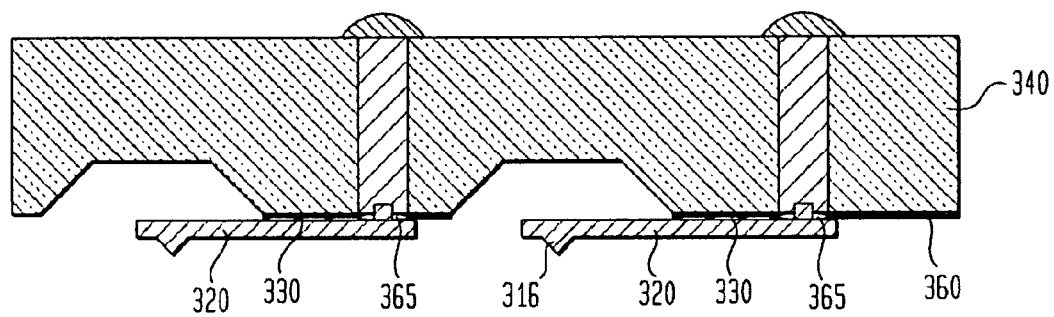

Referring to FIG. 4H, the handle wafer 310, the adhesion layer 305, the thinned wafer 300, and at least a portion of the insulating layer 330 are etched. All of the insulating layer 330 may be etched to leave a flexible interposer according to the present invention.

Figure 4I:
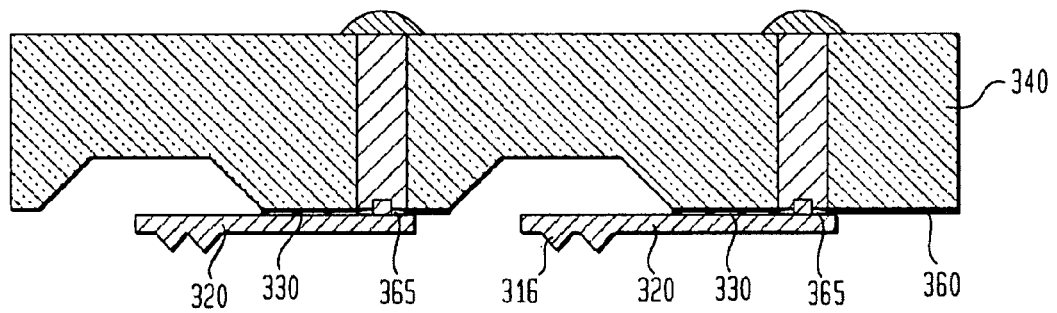

Referring to FIG. 4I, a variation of the flexible interposer structure comprises flexible leads 320 with multiple pins 316. The multiple pins 316 may be formed by etching multiple cavities in a cluster during the formation of the cavities 315. The multiple pins 316 may comprise an array of pins.

The flexible interposer formed by the processes described above with respect to FIGS. 4A-4I use standard semiconductor processes and materials and employs micro-molds. These flexible interposers are thus cheaper and easier to manufacture than existing interposers which are either hand-assembled or require non-standard processing of organic substrates. The flexible interposers formed according to the processes set forth in FIGS. 4A-4I, for example, may also demonstrate improved pitch including smaller pitches than prior art interposers exhibit. The interposer according to the invention may accommodate probing fine pitch pads having pitches of as little as 25 μm, for example. The range of pitches that the flexible interposer may accommodate may be from about 25 μm to about 400 μm. Further still, the processes set forth in FIGS. 4A-4I could also be used to serve as arrays of metallic atomic force microscope tips useful for materials analysis in addition to being used for forming flexible interposers.

FIGS. 5A-5F illustrate a method for making a rigid interposer according to the present invention. The rigid interposer accommodates probing of flexible circuits that is often not accommodated by current interposer technologies.

Figure 5A:
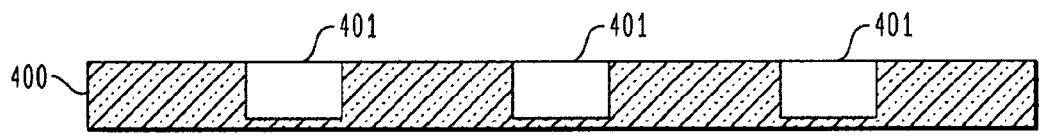
FIGS. 5A-5F show a rigid interposer at various stages of manufacturing process according to a further embodiment of the present invention.

Referring to FIG. 5A, via holes 401 are formed in a wafer 400, for example a silicon wafer. The via holes 401 may be etched as deep trench via holes within the wafer 400, for example, in a conventional manner as known in the art. The vias holes 401 correspond to pad locations on a die to be tested and to pads located in packaging modules holding the die.

Figure 5B:
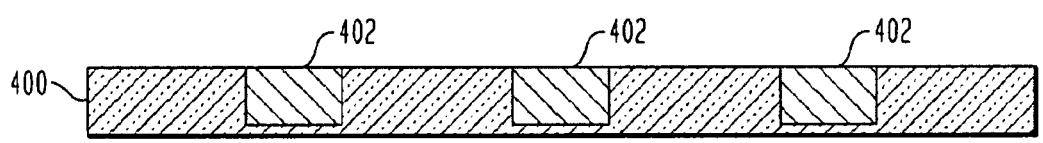

Referring to FIG. 5B, the via holes 401 are filled with a conductive material to form conductive vias 402. The conductive material may be, for example, copper, copper paste, or solder, or other suitable conductive material known in the art.

Figure 5C:
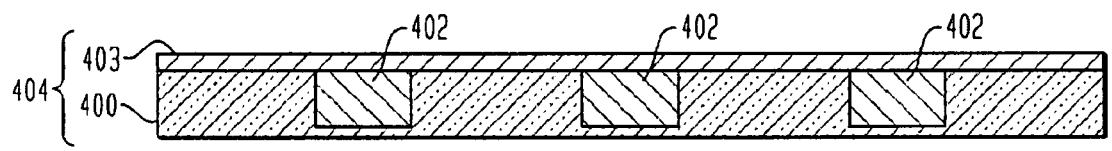

Referring to FIG. 5C, a metal layer 403 is deposited on the wafer 400 and the conductive vias 402 to form a wafer/metal layer combination 404. The metal layer 403 may be a thick copper layer.

Figure 5D:
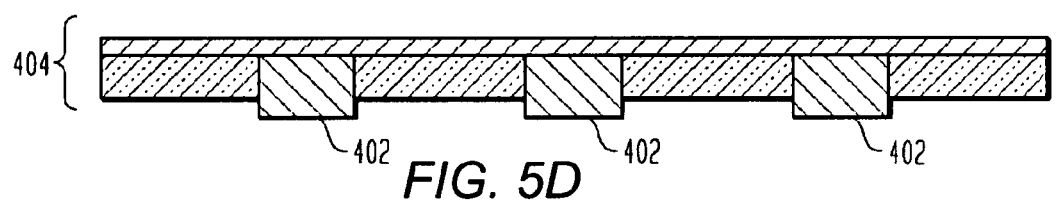

Referring to FIG. 5D, the wafer/metal layer combination 404 is preferably thinned using conventional techniques to expose the bottom of the conductive vias 402, whereby front to back connections through the wafer 400 is provided by the conductive vias 402.

Figure 5E:
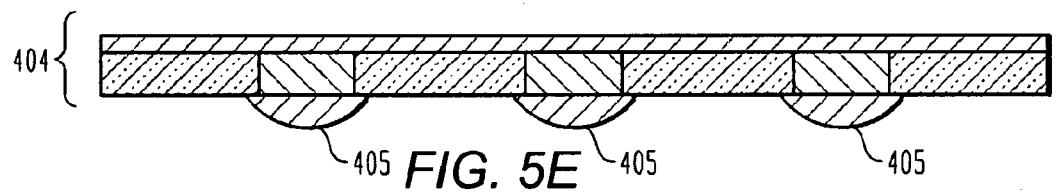

Referring to FIG. 5E, metal contacts 405 are then formed on the exposed vias 401 on the underside of the wafer. The metal contacts 405 may be in the form or shape of bumps, for example, for contacting the pads on the packaging module holding the chip. Of course, the artisan will appreciate that other shapes conducive to contacting the pads on the package holding the die may be used as the metal contacts 405 according to the invention.

Figure 5F:
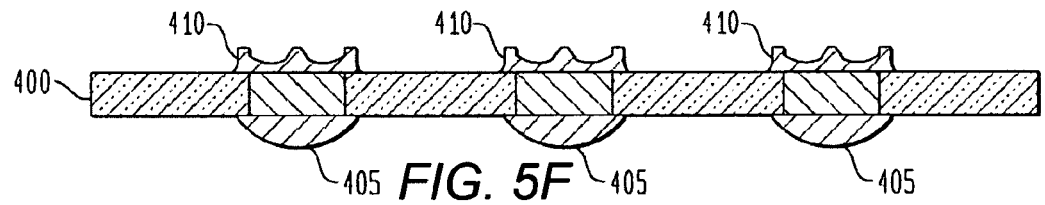

Referring to FIG. 5F, probes 410 are then formed on upper side of the wafer/metal layer combination 404. Each of the probes 410 has a projecting pin in the middle.

Figure 6:
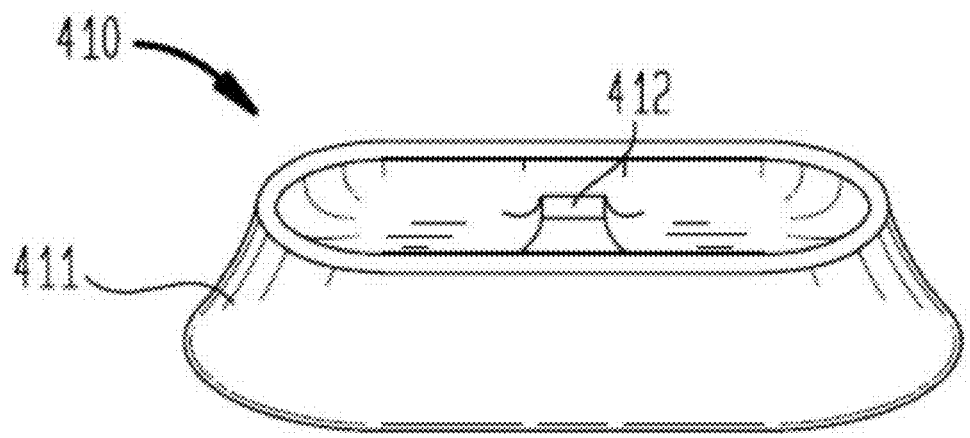
FIG. 6 illustrates an embodiment of a probe for use with a rigid interposer according to the invention.
Figure 7:
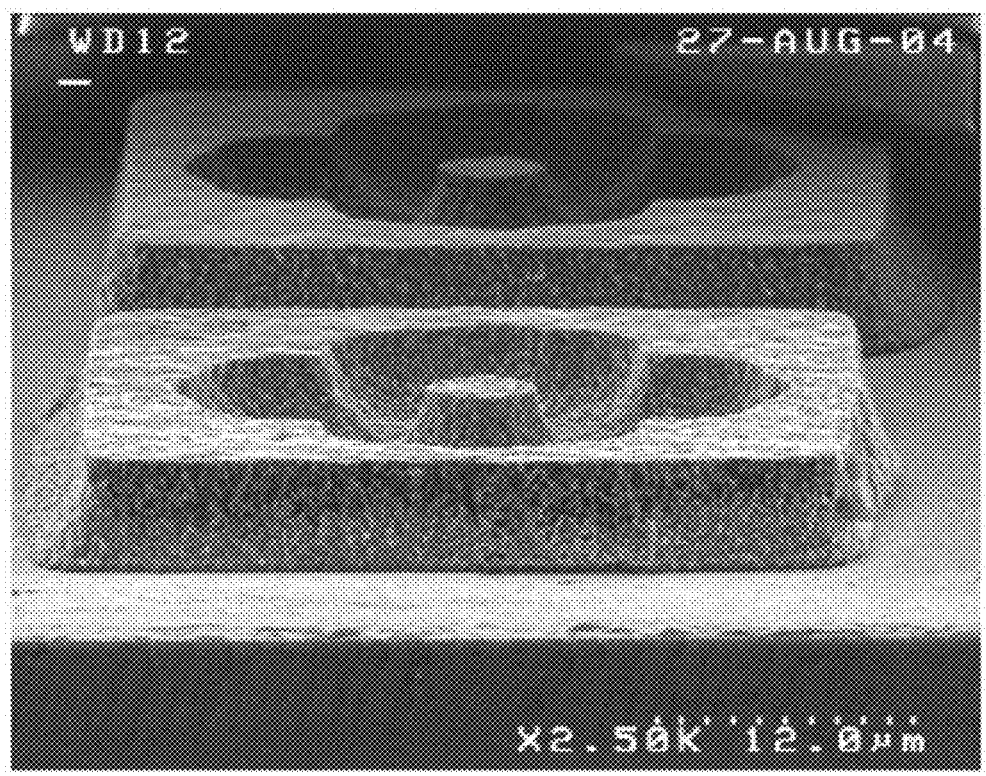
FIG. 7 illustrates a scanning electron micrograph (SEM) of an electroless plated probe.

A schematic bird's eye view of one of the probes 410 is shown in more detail in FIG. 6. An SEM image of one of the probes is shown in FIG. 7. The probes 410 contact the pads of the die under test. Each of the probes 410 may comprises a pad 411 with a pin 412 in the middle of the pad 411. The pad 411 may be a recessed well such that the pin 412 projects out from the well. The outer perimeter of the pad 411 thus comprises a sharp, well-defined edge that in combination with the recessed well captures the solder pad of the die while the central pin 412 punctures through oxides on the surface of the solder pad of the die. Because the probes 410 are rigid and planar, when pressure is applied to the rigid interposer against a flexible circuit during probing, the flexible circuit assumes the planarity of the rigid interposer. As a result, a reliable connection between the pads of the die being tested, the rigid interposer, and the packaging module is accommodated.

To further enhance the ability of the probe pin 412 to puncture oxides on the surface of the solder pads of the die, the probe pin 412 may be coated with a hard material. The hard material may be tungsten or titanium, for example, or other materials that can be electroplated, such as palladium-cobalt or palladium-nickel, for example.

Although the probes 410 may be comprised of other than silicon wafers according to the invention, the use of silicon wafers for the probes 410 minimizes expense as silicon wafers are readily available and understood in the semiconductor manufacturing industry. Likewise, the use of silicon wafers provides additional flexibility to the probes as additional structures such as wiring structures or other active devices, for example, may be provided on either side of the probes. Such additional structures can provide for advanced probing techniques including speed sorting.

Building the probes 410 on rigid substrates enable simplified alignment techniques relative to the solder pads of a die being tested or the packaging modules holding said die. Additional and/or wider guide holes could be drilled along with the vias to enhance the mechanical alignment of the probes 410 with the die and package modules. These holes would align the probe pattern with nanometer accuracy to capture dowel pins connected to the substrate, for example, for very fast and accurate alignment of the probe with the die and packaging module.

While there has been shown and described what is considered to be preferred embodiments of the invention, it will, of course be understood that various modifications and changes in form or detail could readily be made without departing from the spirit and scope of the invention. It is therefore intended that the invention be not limited to the exact forms described and illustrated herein, but should be construed to cover all modifications that may fall within the scope of the appended claims.

What is claimed is:

1. A rigid interposer comprising:
a wafer having a top surface and a bottom surface;
conductive vias comprising a conductive material, located within said wafer, wherein sidewalls of each of said conductive vias contiguously extend from said top surface to said bottom surface;
metal contacts abutting said conductive vias and said bottom surface; and
probes having projecting pins and abutting said conductive vias and said top surface, wherein each of said probes comprises a central pin located in a middle of a pad, and said pad has a recessed well that laterally surrounds said pin, and is laterally surrounded by an outer perimeter portion of said pad, wherein said outer perimeter portion of said pad has an edge which, in combination with said recessed well, is configured to capture a solder pad while said central pin punctures said solder pad.

2. The rigid interposer of claim 1, wherein said wafer comprises Si.

3. The rigid interposer of claim 1, wherein said central pins may penetrate oxides on contact pads of a component to be tested.

4. The rigid interposer of claim 1, wherein said projecting pins comprise a hard material selected from the group consisting of PdNi and PdCo.

5. The rigid interposer of claim 1, wherein each of said conductive vias is a conductive structure that fills a single trench contiguously extending from said top surface to said bottom surface.

6. The rigid interposer of claim 1, wherein an entirety of top surfaces of said conductive vias contact top surfaces of said metal contacts, and an entirety of bottom surfaces of said conductive vias contact bottom surfaces of said probes.

7. The rigid interposer of claim 1, wherein all bottom surfaces of said wafer are coplanar with said bottom surface, and all portions of said metal contacts are located below a level of said bottom surface.

8. The rigid interposer of claim 1, wherein said conducive vias consist of said conductive material.

9. The rigid interposer of claim 1, wherein said metal contacts consist of a metal.

10. The rigid interposer of claim 1, wherein said probes consist of a metal.

11. The rigid interposer of claim 1, wherein said probes consist of a metal, and the only material in said rigid interposer located above a plane of interface between said conductive vias and said probes is said metal.

12. The rigid interposer of claim 11, wherein said conductive vias consist of said conductive material.

13. The rigid interposer of claim 12, wherein said metal contacts consist of another metal.

14. The rigid interposer of claim 12, wherein said conductive material is copper, copper paste, or solder.

15. The rigid interposer of claim 11, wherein said metal consists of copper.

16. The rigid interposer of claim 1, wherein said probes abut all top surfaces of said conductive vias.

17. The rigid interposer of claim 16, wherein said metal contacts abut all bottom surfaces of said conductive vias.

18. The rigid interposer of claim 1, wherein each of said metal contacts underlies an entirety of one of said conductive vias, and each of said probes overlies an entirety of one of said conductive vias.

19. The rigid interposer of claim 18, further comprising wiring structures located on said metal contacts.

* * * * *